United States Patent [19]

Boudou et al.

[11] Patent Number: 5,528,072
[45] Date of Patent: Jun. 18, 1996

[54] INTEGRATED CIRCUIT HAVING A LASER CONNECTION OF A CONDUCTOR TO A DOPED REGION OF THE INTEGRATED CIRCUIT

[75] Inventors: Alain Boudou, Vert; Marie-Francoise Bonnal, Fontenay le Fleury; Marine Rouillon-Martin, Bailly, all of France

[73] Assignee: Bull, S.A., Paris, France

[21] Appl. No.: 288,890

[22] Filed: Aug. 10, 1994

Related U.S. Application Data

[60] Continuation of Ser. No. 92,910, Jul. 19, 1993, abandoned, which is a division of Ser. No. 506,995, Apr. 10, 1990, Pat. No. 5,231,050, which is a continuation of Ser. No. 214,466, Jul. 1, 1988, abandoned.

[30] Foreign Application Priority Data

Jul. 2, 1987 [FR] France ................ 87 09383

[51] Int. Cl.$^6$ .............. H01L 23/525; H01L 23/532
[52] U.S. Cl. .............. 257/530; 257/665; 257/754
[58] Field of Search ................ 257/530, 665, 257/529, 734, 750, 751, 50, 773, 754, 758–760

[56] References Cited

U.S. PATENT DOCUMENTS

| | | | |
|---|---|---|---|
| 3,539,880 | 11/1970 | Squire et al. | 257/530 |
| 4,387,503 | 6/1983 | Aswell et al. | 29/575 |
| 4,543,594 | 9/1985 | Mohsen et al. | 257/530 |
| 4,701,780 | 10/1987 | Hankins et al. | 257/530 |
| 4,751,197 | 6/1988 | Wills | 437/174 |
| 4,823,181 | 4/1989 | Mohsen et al. | 257/530 |
| 4,881,114 | 11/1989 | Mohsen et al. | 257/530 |

FOREIGN PATENT DOCUMENTS 0182851   10/1983   Japan .................... 257/530

OTHER PUBLICATIONS

Cook et al., Connections and Disconnections on Integrated Circuits Using Nanosecond Laser Pulses, App. Phys. Lett., V. 26, No. 3, Feb. 1975, pp. 124–126.

Primary Examiner—Peter Toby Brown
Attorney, Agent, or Firm—Kerkam, Stowell, Kondracki & Clarke; Edward J. Kondracki; John C. Kerins

[57] ABSTRACT

The conductor 15 to be connected to the doped region 12 of the substrate 11 has an edge 15a at which the laser beam 20 is aimed, regulated such as to definitively create a zone of low electrical resistance 19 in the dielectric layer 13 that separates the conductor from the doped region. The invention is particularly applicable to programming by laser of read only memories and defective integrated circuits with a view to correcting them.

13 Claims, 1 Drawing Sheet

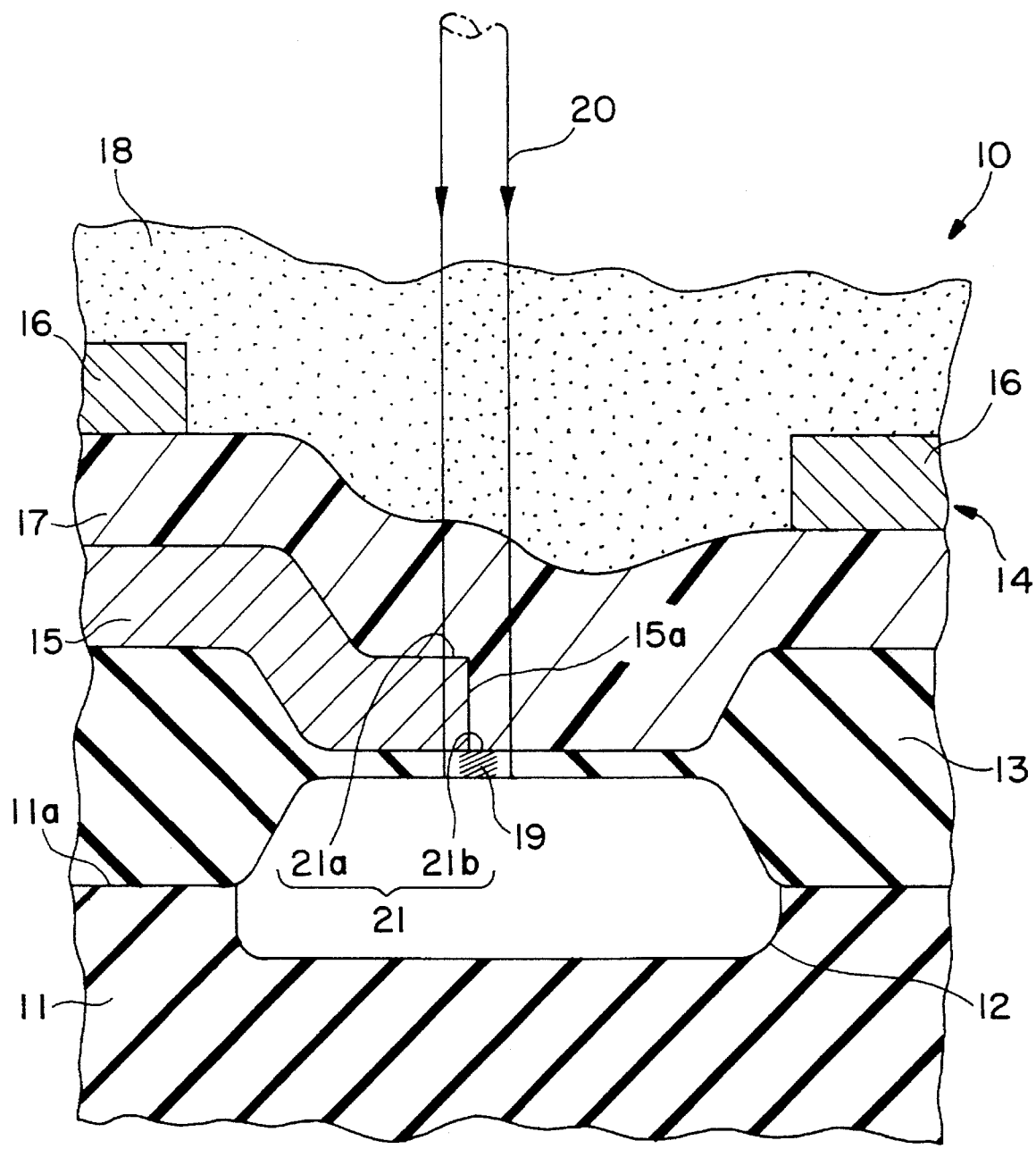

INTEGRATED CIRCUIT HAVING A LASER CONNECTION OF A CONDUCTOR TO A DOPED REGION OF THE INTEGRATED CIRCUIT

This is a continuation of application Ser. No. 08/092,910, filed Jul. 19, 1993 and now abandoned, which is a division of Ser. No. 506,995 filed Apr. 10, 1990 and now U.S. Pat. No. 5,231,050, which is a continuation of Ser. No. 214,466 filed Jul. 1, 1988 and now abandoned.

FIELD OF THE INVENTION

The invention relates to a method of connecting a conductor to a doped region of a substrate of an integrated circuit using a laser, and an integrated circuit utilizing the method.

BACKGROUND OF THE INVENTION

An integrated circuit, currently known as a chip, is essentially a semiconductor substrate including doped regions for defining electronic components and having an interconnect structure for these components. The interconnect structure rests on the substrate via a dielectric silicon dioxide ($SiO_2$) layer formed by growth of the material of the substrate. Generally, the dielectric layer is thin (several tens of nanometers thick) above the doped regions, and thick (several nanometers thick) between these regions. The interconnect structure presently comprises a plurality of conductive layers separated by insulating layers and connected to one another at certain points by vias passing through the insulating layers. Each conductive layer comprises numerous conductors parallel to one another in a direction orthogonal to the conductors of a neighboring conductive layer. Conductors of the lower layer are connected with the corresponding regions of the substrate via openings made in the thin dielectric layer covering these regions.

At present in the manufacture or design of very large scale integrated circuits, or VLSI chips, attempts are being made to make wide use of the laser to modify the circuits on these chips. In particular, modification of the circuits of a chip is done to correct certain connection defects. Connections made by laser are then programmed for reconfiguring a circuit because of a defect, or to connect a substitute circuit to a defective circuit in accordance with the technique known as redundancy of the functional blocks of an integrated circuit. On the other hand, modification of the integrated circuits in a chip naturally takes place when the chip is, or includes, a programmable read only memory (PROM). The conduction state of the cells of the memory is determined by one or more connections between predetermined conductor elements of each cell. The use of the laser is one solution intended for programming a PROM. In conclusion, laser programming of the connections in the integrated circuits of a chip has numerous applications and numerous advantages.

Several methods are now known for making an electrical connection of two superimposed conductors of an integrated circuit, or between a conductor and a region of the substrate, at a point through the thin dielectric layer by laser beam.

One known method of programmable bonding by laser of two superimposed conductors is described in particular in the article by N. S. Platakis in the Journal of Applied Physics, Vol. 47, No. 5, May 1976, pp. 2120–2128. At the desired bonding point, a laser beam is applied, the energy, diameter, number and duration of the pulses of which are determined so as to progressively open the upper conductor, then the dielectric layer and, partially, the lower conductor and to form a contact between the two conductors by ejecting melted material of the lower conductor up to the level of the upper conductor. Then the two conductors are connected to one another by the solidified ejections on the walls of a crater, which thus has the approximate shape of a metallized hole. This method has numerous disadvantages.

First, it will be understood that the uncontrollable ejections of melted material of the lower conductor placed beneath a laser beam, under identical conditions, yield different configurations of the band of the conductors in each crater. As a result, the bonds formed by this method, under identical conditions, have different electrical connection qualities. Experience has confirmed the defects in terms of replicability and reliability of this method.

As a second disadvantage, the formation of a crater requires the use of a powerful laser beam and damages the structure of the two conductor elements and the insulating layer separating them. On the one hand, the thermal shock can create electrical defects in the active elements (junctions, transistors, and so forth) which surround the crater. On the other hand, the thermal shock creates a dislocation of the structure of the conductor elements, which is particularly undesirable when the lower conductor element is a doped region of a silicon substrate. Even if the lower element is a conductor of the interconnect structure, this element must have a minimum thickness so as not to damage the insulating layer that separates it from the substrate. Consequently the connection by laser, in the form of a crater, is limited in practice to the connection of two conductor elements of the interconnect structure formed above a silicon substrate. It follows that for a desired connection between an upper conductor and a doped region of the substrate, this region must be connected to an intermediate conductor, with which the upper conductor will be connected by a crater sufficiently distant from the doped region of the substrate.

Another disadvantage of this connection method is that it cannot be done after the manufacture of the integrated circuit. The manufacture of an integrated circuit ends with the covering of the entire interconnect structure with a thick passivation layer adapted for protecting the integrated circuit electrically, mechanically and chemically. It will be understood then that laser connection cannot be done correctly except prior to the deposition of the passivation layer, that is, during the process of manufacture of the integrated circuit. This disadvantage translates into a lack of flexibility in programming the bonds in the integrated circuit and an increase in cost.

Finally, connection at one point by laser in the form of a crater is easily observable by optical microscope, and an observer can learn the entire configuration of the connections made on an integrated circuit from it. This kind of connection thus cannot be used when the connections are part of confidential information or that are to remain inviolable, as is the case for example for integrated circuit memories in credit cards (known as smart cards).

Another known method for programmable bonding by laser of two superimposed conductors is described in particular in the article by J. I. Raffel et al, entitled "Laser Programmed Vias for Restructurable VLSI" in the publication "Technical Digest of the International Electron Devices Meeting", 1980, pp. 132–135. This method comprises using amorphous silicon in the dielectric layer at the level of the bonding point. The use of amorphous silicon in predetermined regions of the dielectric layer has the disadvantage of complicating the method of manufacturing the integrated circuit and of prohibiting programming any bonds by laser outside these regions.

The invention proposes a method of connection by laser of a conductor element to a doped region of the substrate of an integrated circuit, which has the advantage over the prior methods of being simple, reliable and effective, with a less powerful laser, which is usable during and after the manufacture of the integrated circuit and leaves practically no trace that is detectable by microscope of the connection that has been made.

SUMMARY OF THE INVENTION

The method according to the invention of electrical connection by laser of a conductor to a doped region of the substrate of an integrated circuit by the intermediary of a thin dielectric layer comprises disposing one edge of the conductor above the region, causing the laser beam to straddle the edge of the conductor and the region, and regulating the power, the diameter, the number and duration of the pulses of the laser beam such as to definitively create defects, in one zone of the dielectric layer, which lend it a low electrical resistance.

The characteristics and advantages of the invention will become apparent from the ensuing detailed description of a preferred embodiment shown in the drawing, which is understood to be solely exemplary and not in any way limiting to the scope of the invention.

BRIEF DESCRIPTION OF THE DRAWING

The single drawing FIGURE is a cross-sectional view of an integrated circuit showing the connection by laser according to the invention of a conductor of the interconnect structure to a doped region of the semiconductor substrate of the integrated circuit.

DESCRIPTION OF THE PREFERRED EMBODIMENT

Turning to the drawing, the integrated circuit 10 substantially includes a monocrystalline semiconductor substrate 11, typically of silicon, the upper surface 11a of which includes doped regions 12. The drawing shows a fragmentary sectional view of the integrated circuit 10 at the level of a doped region 12. In the drawing, the proportions of the length have not been drawn to scale, for the sake of simplicity in the drawing, and will be readily corrected appropriately by one skilled in the art. A dielectric layer 13 of silicon dioxide (SiO2) is formed by oxidation of the silicon of the substrate 11 over its entire surface 11a. At the level of the doped regions 12, the dielectric layer is ordinarily very thin, on the order of several tens of nanometers. An interconnect structure 14 of the regions 12 of the substrate 11 is formed on the dielectric layer 13. In the conventional manner, the network 14 shown comprises lower conductors 15 and upper conductors 16 separate from one another by an insulating layer 17. The lower conductors 15 may be metallic, ordinarily of aluminum, or may be made of polycrystalline silicon also known as polysilicon, suitably doped so as to be conductors, or may comprise a metal-silicon alloy. The upper conductors 16 are typically of metal, such as aluminum. The example shown relates to the use of the invention after the manufacture of the integrated circuit 10, which in other words has already been provided with a passivation layer 18 covering the interconnect structure 14 to protect it electrically, mechanically and chemically. The passivation layer 18 is ordinarily made of a glass doped with phosphorus.

To make the connection 19 of a conductor 15 to a region 12 by means of a laser beam 20, the method according to the invention comprises, first, disposing one edge of the conductor 15 above the region 12. In the example shown, it is the end 15a of the conductor 15 that is placed at the region 12 and is thus considered as an edge in the context of the invention. However, this may instead be a long edge of the conductor. The method next comprises using a laser beam 20 having a diameter B, a power P and a pulse duration T. The laser beam 20 is aimed orthogonally at the upper face 11a of the substrate 11, such that its target zone 21 is divided into a zone 21a on the edge 15a of the conductor 15 and a zone 21b on the dielectric layer 13. The target zone 21 is then placed straddling the conductor 15 and the dielectric layer 13 in the region 12. Finally, the power $\underline{P}$, the diameter $\underline{D}$, the number $\underline{N}$ and the duration $\underline{T}$ of the pulses of the laser beam 20 are adjusted such as to definitively create defects in the zone 19 of the dielectric layer that lend it a low electrical resistance. The connection zone 19 substantially corresponds to the zone 21 covered by the beam 20. The low electrical resistance obtained under various experimental conditions extends over a range between approximately 100 $\Omega$ and several k$\Omega$ more particularly between 300 $\Omega$ and 3 k$\Omega$.

By way of example, the following typical experiment was performed with an integrated circuit the silicon dioxide dielectric layer 13 of which had a thickness of 70 nm, the region 12 had a depth of 400 nm, the polysilicon conductor 15 had a thickness of 500 nm, and the insulating layer covering it was approximately one micrometer in thickness. The laser beam 20 had a diameter D of 5 μm and delivered a power P of 0.76 watts during a single pulse (N=1) of duration T=1 ms. The resistance measured between the conductor 15 and the region 12 was approximately 350 $\Omega$.

The resistance of the connection 19 depends on the parameters of use of the beam, the dimensions of the elements through which the beam passes, and their type. A metal conductor 15 is suitable. However, it has been observed that if the conductor 15 is made of doped polycrystalline silicon of a given type, the connection 19 according to the invention cannot exist except if the region 12 and the conductor 15 have the same type of doping. Hence the type of doping of the polysilicon conductor 15 must be selected, or a sufficient existing region must be located over the substrate, in order to make a connection 19 according to the invention; or one must even create such a region, or append to the conductor 15 a metal conductor that makes it possible to make the connection 19.

The first advantage of the invention is that a reliable and effective connection is made in a simple manner with a laser beam of very low energy by comparison with the indispensable energy required to form a crater in accordance with the prior art.

The second advantage of the invention is the fact that the connection zone 19 according to the invention is practically undetectable by the optical microscope. It is thus assumed that the low energy brought to bear by the laser beam is utilized by the thin dielectric layer 13 to create definitive defects, with the surrounding conductive material, which are invisible yet sufficient for obtaining a low electrical resistance. It has been demonstrated that the connection zone 19 extends only within the thin dielectric layer and when viewed in an optical microscope practically does not change the conductor elements connected according to the invention.

The third advantage of the invention is that a connection is made independently of the conductor elements and insulating elements 15, 16, 17, 18 successively covering the thin dielectric layer. Since a very low energy at the level of this layer is sufficient, the energy at the outlet of the laser, taking into account the absorption of energy in the preceding elements, remains low.

In any case, the energy absorbed in these elements is incapable of modifying their nature or their structure.

On the other hand, it should be noted that the components of the integrated circuit can be made of doped regions of the substrate and conductors formed above the substrate, in the vicinity of these regions and by the intermediary of thin dielectric layers. This is the case, for example, with MOS transistors (metal oxide semiconductor transistors), the gate of which is made of a conductive strip extending above the substrate and separating the two doped regions from the drain and source of the substrate. The gate conductor may be of metal or of highly doped polycrystalline silicon. The invention equally relates to a conductor of that type. For example, by lengthening the gate of an MOS transistor, the invention makes it possible to connect the gate by laser directly to a neighboring region that is either independent of or a constituent part of some other component.

It will now be understood that the application of the invention to programming by laser of connections of integrated circuits is highly advantageous and very widely applicable. In particular, programming by laser in accordance with the invention will be highly esteemed for correcting integrated circuits in VSLI chips or for programming of PROMs.

What is claimed is:

1. An integrated circuit comprising a substrate having at least one doped region subjacent a conductor, and an intermediary dielectric layer disposed therebetween, the conductor having at least an edge adjacent and above said doped region, wherein said dielectric layer has an area of lowered electrical resistance extending between said doped region and said conductor which forms an interconnect region of an interconnect structure, said interconnect region being substantially independent of said conductor, said interconnect region containing definitively created defects therein created by exposure of said area to a laser beam, wherein said defects lower an electrical resistance of a dielectric material of said dielectric layer in said exposed area without substantially changing a structure of said conductor and of said doped region, said interconnect region being formed in said dielectric layer in an area defined by said area exposed to said laser beam, and which is partially located under said edge of said conductor and which partially extends beyond said edge.

2. An integrated circuit as defined by claim 1 wherein the conductor is of metal.

3. An integrated circuit as defined by claim 2 wherein the conductor is an element of the interconnect structure (14).

4. An integrated circuit as defined by claim 2 wherein the conductor is an element of a component of the integrated circuit.

5. An integrated circuit as defined in claim 2 wherein the interconnect structure (14) comprises said interconnect region, said conductor (15), an upper conductor (16), and a passivation layer (18).

6. An integrated circuit as defined by claim 1 wherein the conductor contains doped polycrystalline silicon, the doping of which is the same type as the doped region.

7. An integrated circuit as defined by claim 6 wherein the conductor is an element of a component of the integrated circuit.

8. An integrated circuit as defined in claim 6 wherein the interconnect structure (14) comprises said interconnect region, said conductor (15), an upper conductor (16), and a passivation layer (18).

9. An integrated circuit as defined by claim 1 wherein the conductor is an element of the interconnect structure (14).

10. An integrated circuit as defined in claim 9 wherein the interconnect structure (14) comprises said interconnect region, said conductor (15), an upper conductor (16), and a passivation layer (18).

11. An integrated circuit as defined by claim 1 wherein the conductor is an element of a component of the integrated circuit.

12. An integrated circuit as defined in claim 11 wherein the interconnect structure (14) comprises said interconnect region, said conductor (15), an upper conductor (16), and a passivation layer (18).

13. An integrated circuit as defined in claim 1 wherein the interconnect structure (14) comprises said interconnect region, said conductor (15), an upper conductor (16), and a passivation layer (18).

* * * * *